United States Patent [19]
Takamuki

[11] Patent Number: 6,057,794
[45] Date of Patent: May 2, 2000

[54] SIGMA-DELTA MODULATION CIRCUIT

[75] Inventor: Hideharu Takamuki, Kanagawa, Japan

[73] Assignee: Sony Corporation, Tokyo, Japan

[21] Appl. No.: 09/104,428

[22] Filed: Jun. 25, 1998

[30] Foreign Application Priority Data

Jul. 2, 1997 [JP] Japan .................................... 9-177469

[51] Int. Cl.$^7$ ................................................ H03M 3/00
[52] U.S. Cl. .......................................... 341/143; 341/155
[58] Field of Search .................................... 341/143, 144, 341/155

[56] References Cited

U.S. PATENT DOCUMENTS

| | | | |
|---|---|---|---|
| 5,278,559 | 1/1994 | Yazawa | 341/143 |
| 5,712,874 | 1/1998 | Okamoto | 375/243 |
| 5,784,017 | 7/1998 | Craven | 341/126 |
| 5,872,532 | 2/1999 | Yasuda | 341/143 |

*Primary Examiner*—Brian Young
*Assistant Examiner*—Peguy JeanPierre
*Attorney, Agent, or Firm*—Ronald P. Kananen; Rader, Fishman & Grauer PLLC

[57] ABSTRACT

A sigma-delta modulation circuit having the function of adjusting an amplitude by a small sized, simplified structure, wherein a parameter stored in a ROM controls an amplitude of a conversion signal in response to an amplitude parameter set by an amplitude control signal, a subtractor outputs the subtraction result of an input signal and the conversion signal, a cumulation circuit generates a cumulation signal, and a binary comparator compares the cumulation signal with a predetermined reference value and generates an output signal of the sigma-delta modulation circuit in accordance with the comparison result. The signal is output to a delay circuit which generates a delay signal by giving a delay time of, for example, one sampling period. The result is input to the ROM. Accordingly, the amplitude of the output signal can be controlled by setting an amplitude parameter.

17 Claims, 7 Drawing Sheets

SIGMA-DELTA MODULATION CIRCUIT

BACKGROUND OF THE INVENTION

1. Field of the Invention

The present invention relates to a sigma-delta (τΔ) modulation circuit for an analog/digital (A/D) converter and a digital/analog (D/A) converter.

2. Description of the Related Art

An A/D converter, a D/A converter, and a signal transmission apparatus used in the technical fields of audio signal processing, data communications, etc. are constructed using, for example, a sigma-delta modulation circuit.

FIG. 7 is a view of the configuration of an ordinary sigma-delta modulation circuit.

As shown in FIG. 7, the sigma-delta modulation circuit comprises a subtractor 10, an accumulator 11, a binary comparator 12, a delay circuit 13, and a constant coefficient multiplier 14. The sigma-delta modulation circuit as a whole functions as a D/A converter for converting a digital input signal $S_{IN}$ to an output signal $S_{OUT}$.

The subtractor 10, the accumulator 11, and the binary comparator 12 are digital type arithmetic and logic units.

The subtractor 10 subtracts a modulation signal S14 from the input signal $S_{IN}$ to generate a subtracted signal S10 and outputs it to the accumulator 11.

The accumulator 11 cumulatively adds the subtracted signal S10 from the subtractor 10 every sampling period to obtain a cumulative addition signal S11 and outputs it to the binary comparator 12.

The binary comparator 12 compares the cumulative addition signal S11 with a predetermined reference value. When the cumulative addition signal S11 is larger than the reference value, it outputs "+1" as the output signal $S_{OUT}$, while outputs "−1" in other cases. This value itself is output as the output signal $S_{OUT}$.

The delay circuit 13 outputs a delay signal S13 obtained by delaying the output signal $S_{OUT}$, which is "+1" or "−1", by one sampling period and outputs it to the constant coefficient multiplier 14.

The constant coefficient multiplier 14 multiplies the delay signal S13 from the delay circuit 13 by a constant Δ. As a result, when the delay signal S13 is "+1", it outputs "+Δ" as a modulation signal S14, while when the delay signal S13 is "−1", it outputs "−Δ".

According to the sigma-delta modulation circuit shown in FIG. 7, the output signal $S_{OUT}$ is expressed as an approximation of the digital input signal $S_{IN}$ using the codes of "+1" or "−1". This signal can be regarded as an analog signal generated by adding a quantization error, which is small at the low frequency range and large at the high frequency range, to the digital input signal $S_{IN}$. Therefore, by passing the output signal $S_{OUT}$ through an analog type low-pass filter, the circuit functions as a D/A modulation circuit as a whole.

Note that a case of a first order type sigma-delta modulation circuit is shown in FIG. 7, however, the basic operation principle is same in a sigma-delta modulation circuit of the secondary order or higher order in which only the portion of the subtractor 10 and the accumulator 11 in FIG. 7 is replaced by circuits having a higher order linear transfer function.

When using the sigma-delta modulation circuit shown in FIG. 7, for example in a communication apparatus, the amplitude of the output signal obtained in the sigma-delta modulation circuit is required to be controlled in some cases in order to adjust the amplitude of the modulation signal.

The sigma-delta modulation circuit does not comprise a gain adjustment function circuit in itself. A gain adjustment circuit (not shown) is provided outside the modulation circuit.

However, with this configuration, there is the disadvantage that the circuit becomes complicated and large in size. Particularly, in a sigma-delta modulation circuit used in a modulating portion of a communication device, the variable amplitude range is often narrow. Accordingly, while a large dynamic range is not required, there are strong demands for adjusting the amplitude by precise steps and simplifying the circuit configuration.

Similarly, when a sigma-delta modulation circuit is used as an A/D modulation circuit for the modulation of a communication apparatus, the amplitude range is often relatively narrow. Accordingly, while a large dynamic range is not required, there are strong demands for adjusting the amplitude by precise steps and simplifying the circuit configuration.

SUMMARY OF THE INVENTION

An object of the present invention is to provide a sigma-delta modulation circuit having an amplitude adjusting function with a small sized, simplified configuration.

According to the present invention, there is provided a sigma-delta modulator comprising a computing means receiving an input signal; a cumulation means for cumulating a signal from the computing means; a comparison means for comparing a cumulation signal from the cumulation means with a predetermined reference value and outputting a modulation signal which is finite and any one of a plurality of values, the values being defined in accordance with a level of the input signal; a delay means for delaying the modulation signal by a predetermined time; and a conversion means for converting a delay signal from the delay means to a conversion signal in response to a parameter which is arbitrarily set, the computing means computing the input signal and the conversion signal in a predetermined manner and outputting a computed signal to the cumulation means.

Preferably, the computing means subtracts the conversion signal from the input signal.

Alternatively, preferably, the computing means comprises a first subtraction means for subtracting the conversion signal from the input signal and outputting a first subtraction signal; a first cumulation means for cumulating the first subtraction signal and outputting a first cumulation signal; and a second subtraction means for subtracting the conversion signal from the first cumulation signal.

Alternatively, preferably the computing means comprises a plurality of series connected circuit means, each circuit means comprising a level adjustment means for adjusting the level of the conversion signal in response to a predetermined constant; a first subtraction means for subtracting the adjusted conversion signal from the input signal; a cumulation means for cumulating the subtracted signal and outputting the same as a cumulation signal, and the sigma-delta modulator further comprises a second subtraction means for subtracting the level adjusted conversion signal from an output signal from the final stage of the plurality of series connected circuit means.

Alternatively, preferably, the conversion means comprises a multiplication means for multiplying the delay signal and a constant defined by the parameter applied to the conversion means and outputting a multiplied signal.

Alternatively, preferably, the conversion means comprises a logical processing means for processing the delay signal by a first logical processing method, processing the parameter by a second logical processing method, and outputting output data as a result of the first and second processing methods.

Preferably, the logical processing means comprises a memory means storing data in a table manner and wherein the output data is determined by a lock-up manner of the delay signal and the parameter.

Alternatively, preferably, the conversion means comprises a variable voltage providing means for controlling the delay signal in response to the parameter and providing the conversion signal having a variable level in accordance with the parameter.

Alternatively, preferably, the input signal is a digital signal and wherein the cumulation means comprises a digital accumulator cumulatively adding the computed signal at predetermined time intervals Alternatively, preferably, the input signal is an analog signal and wherein the cumulation means comprises an analog integrator integrating the computed signal.

Alternatively, preferably, the computing means, the cumulation means, the comparison means, the delay means, and the conversion means operate by a predetermined sampling period.

Preferably the modulator further comprises a sampling means for sampling the input signal and outputting the same to the computing means.

More preferably, the delay time is defined by the sampling time.

Further preferably, the cumulation means comprises an adding means and a delay means, the adding means adding the computed signal from the computing means and a delay signal from the delay means, and the delay means delaying an added signal at the adding means by a predetermined sampling time and outputting the same to the adding means.

According to the present invention, the level of the delay signal of the modulation signal can be controlled in response to a predetermined parameter in the sigma-delta modulation circuit. For example, the amplitude of the above delay signal can be controlled by the multiplication by a predetermined value set by the above parameter. The subtractor calculates the difference of the input signal from the outside and the above delay signal of an adjusted level. The results are cumulated by a cumulation means such as an accumulation means or integration means. The comparing method compares the cumulative signal with a predetermined reference value and outputs a modulation signal of a predetermined level, for example, a signal which takes one of a plurality of bounded values, in response to the calculated result as a modulation signal.

As explained above, according to the sigma-delta modulation circuit, the amplitude of the modulation signal can be adjusted with smaller sized, more simplified circuit structure.

BRIEF DESCRIPTION OF THE DRAWINGS

These and other objects and features of the present invention will become clearer from the following description of the preferred embodiments given with reference to the accompanying drawings, in which.

DESCRIPTION OF THE PREFERRED EMBODIMENTS

Figure 1:
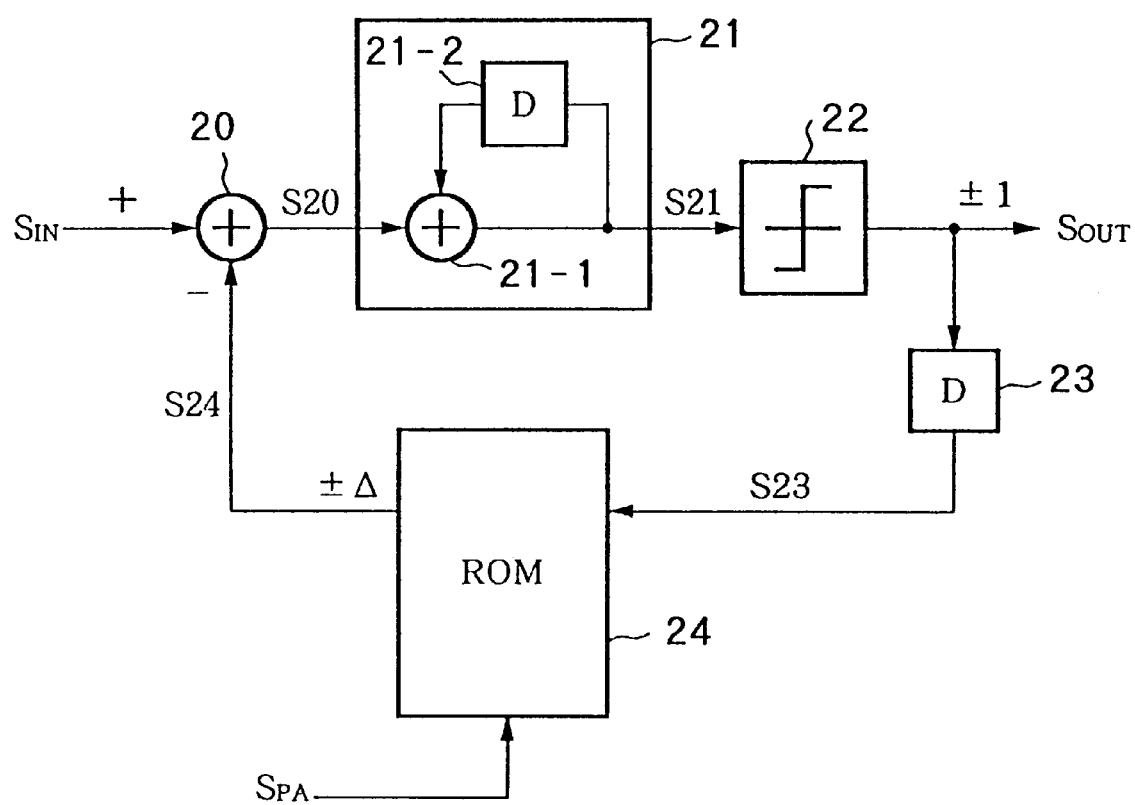
FIG. 1 is a circuit diagram of a sigma-delta modulation circuit according to a first embodiment of the present invention.

FIG. 1 is a circuit diagram of a sigma-delta modulation circuit according to a first embodiment of the present invention.

Figure 2:
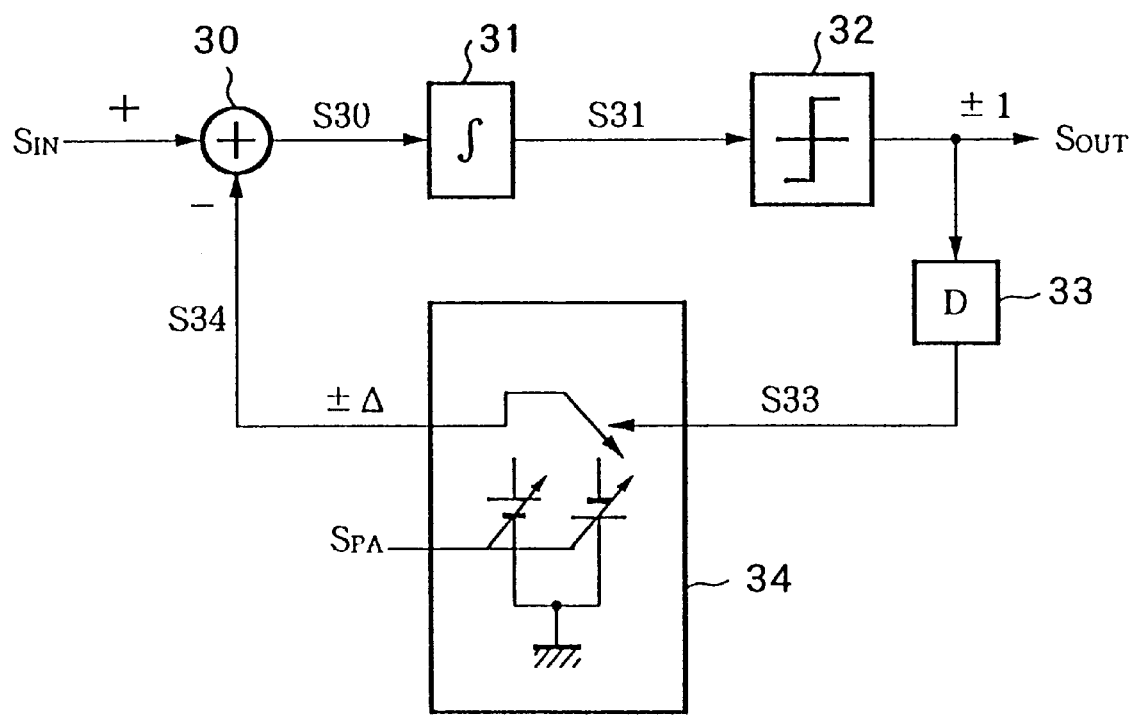
FIG. 2 is a circuit diagram of a sigma-delta modulation circuit according to a second embodiment of the present invention.

As illustrated in the FIG. 2, a sigma-delta modulation circuit of the present embodiment comprises a subtractor 20, an accumulator 21, a binary comparator 22, a delay circuit 23, and a read only memory (ROM) 24. This sigma-delta modulation circuit functions as a whole as a D/A converter.

The subtractor 20, the accumulator 21, and the binary comparator 22 are digital type arithmetic and logic units.

The subtractor 20 subtracts the conversion signal S24 from the input signal $S_{IN}$ and outputs a subtracted signal S20 to the accumulator 21.

The accumulator 21, which comprises an adder 21-1 and a delay circuit 21-2, cumulatively adds the subtracted signal S20 from the subtractor 20 every sampling period and outputs a cumulative addition signal S21 to the binary comparator 22. The adder 21-1 adds the subtracted signal S20 from the subtractor 20 and the delay signal from the delay circuit 21-2 and outputs the obtained added signal as the cumulative addition signal S21 to the binary comparator 22. The delay circuit 21-2 generates the delay signal by delaying the cumulative addition signal, for example, by one sampling period and outputs the delay signal to the adder 21-1.

The binary comparator 22 compares the cumulative addition signal S21 with a predetermined reference value. When the cumulative addition signal S21 is larger than the predetermined reference value, it outputs "+1" as a comparison signal, while when the cumulative addition signal S21 is smaller than the predetermined reference value, it outputs "−1". The comparison signal from the binary comparator 22 is output as an output signal $S_{OUT}$ of the sigma-delta modulation circuit and input to the delay circuit 23.

The delay circuit 23 generates a delay signal S23 by delaying the output signal $S_{OUT}$, which is "+1" or "−1", by one sampling period and outputs it to the ROM 24.

The ROM 24 selects one value written in a table in advance in response to two values, that is, the delay signal S23 from the delay circuit 23 and the amplitude parameter set by the amplitude control signal $S_{PA}$, and outputs a conversion signal S24 having a level corresponding to the selected value.

Here, the amplitude parameter set by the amplitude control signal $S_{PA}$ takes, for example, two values, that is, "0"

and "1". In this case, there are four possible combinations of the delay signal S23 and the amplitude parameter. Here, in this embodiment, values such as shown in Table 1 are respectively written in the ROM 24 in accordance with the four combinations:

TABLE 1

| Delay signal S23 | Amplitude parameter | Output signal S24 |
|---|---|---|
| −1 | 0 | −Δ1 |
| +1 | 0 | +Δ1 |
| −1 | 1 | −Δ2 |
| +1 | 1 | +Δ2 |

Assume that in Table 1, Δ1 and Δ2 are made constants and Δ1=k×Δ2 (k=constant).

Below, an explanation will be given of the operation of the sigma-delta modulation circuit with reference to FIG. 1.

In the sigma-delta modulation circuit, both the input signal $S_{IN}$ and the conversion signal S24 from the ROM 24 are input to the subtractor 20.

Note that the sign of the conversion signal S24 from the ROM 24 is determined in accordance with the delay signal from the delay circuit 23. The amplitude thereof is controlled in response to the amplitude parameter set by the amplitude signal $S_{PA}$.

The subtractor 20 subtracts the modulation signal S24 from the input signal $S_{IN}$ to obtain the subtracted signal S20. The subtracted signal is then cumulatively added in the accumulator 21 and output as the cumulative addition signal S21 to the binary comparator 22.

The binary comparator 22 compares the cumulative addition signal S21 with a predetermined reference value. When the cumulative addition signal S21 is larger than the reference value, "+1" is generated as the output signal $S_{OUT}$, while when it is smaller, "−1" is generated. The output signal is also output to the delay circuit 23.

The delay circuit 23 generates the delay signal S23 by giving a delay time of, for example, one sampling period to the output signal $S_{OUT}$ of the sigma-delta modulation circuit and outputs it to the ROM 24.

The ROM 24 generates the conversion signal S24 having a predetermined level in accordance with the input delay signal S23 and the amplitude parameter set by the amplitude control signal $S_{PA}$ and in accordance with the content stored in the above table and outputs the conversion signal S24 to the subtractor 20.

A circuit to which the conversion signal S24 is input and which outputs the cumulative addition signal S21 is called a noise shaper. The noise shaper in the present embodiment is composed of a circuit having a first order transfer function (a first order delay characteristic) realized by the subtractor 20 and the accumulator 21.

In the sigma-delta modulation circuit, it is considered that the subtractor 20, accumulator 21, and delay circuit 23 have linear characteristics. Namely, when the input signal is multiplied by a constant, the output also becomes a multiple of the constant. For example, as shown in the Table 1, when comparing a case given the amplitude parameter of "0" with a case of "1", the conversion signal S24 having a value of 1/k is input to the subtract or 20 in the latter case. When looking at this case focusing on a loop of a series of the signals S20, S21, S22, S23, and S24, when the reference value of the binary comparator 22 is set to "0", it is equivalent to a case where the conversion signal S24 becomes 1/k, and when it becomes equivalent in operation to a case when the output signal $S_{OUT}$ gives "0" as the amplitude control signal $S_{PA}$, the input signal $S_{IN}$ is multiplied by k. Namely, the change of the amplitude parameter set by the amplitude control signal $S_{PA}$ from "0" to "1" makes the amplitude of the output signal $S_{OUT}$ a multiple of k.

As explained above, according to the present embodiment, the ROM 24 controls the amplitude of the conversion signal S24 in accordance with the level of the delay signal S23 from the delay circuit 23 and the amplitude parameter set by the amplitude control signal $S_{PA}$. The subtractor 20 performs subtraction on the signal S24 and the input signal $S_{IN}$ and outputs the subtraction result S20 to the accumulator 21 where the cumulative addition signal S21 is generated and input to the binary comparator 22. The binary comparator 22 compares the cumulative addition result S21 with a predetermined value and outputs the output signal $S_{OUT}$ of the sigma-delta modulation circuit in accordance with the result of the comparison. Furthermore, the output signal $S_{OUT}$ is also output to the delay circuit 23, which generates the delay signal S23 obtained by delaying the input signal $S_{IN}$ by the delay time, for example, one sampling period. The delay signal S23 is input to the ROM 24. As a result, it is possible to equivalently set an amplitude of the output signal $S_{OUT}$ of the sigma-delta modulation circuit to a multiple of k by setting the parameter k in accordance with the desired amplitude to the ROM 24 by the amplitude control signal $S_{PA}$. Therefore, the control of the amplitude can be realized by the small sized, simplified circuit structure.

Note that, in the above description, an amplitude parameter having two values, for example, "0" and "1", is set in the ROM 24 based on the amplitude control signal $S_{PA}$, however, the present embodiment is not limited to such case. It is possible to set two or more parameters by the amplitude control signal $S_{PA}$. For example, by setting a plurality of parameters by the amplitude control signal $S_{PA}$, and by setting the conversion signal S24 in response to each parameter as a ratio of the inverse of the desired amplitude, it is possible to control the conversion signal S24 from the ROM 24 to the plurality of amplitudes by the amplitude control signal $S_{PA}$.

Second Embodiment

FIG. 2 is a circuit diagram of the sigma-delta modulation circuit according to a second embodiment of the present invention.

As shown in the figure, the sigma-delta modulation circuit of the present embodiment comprises a subtractor 30, an integrator 31, a binary comparator 32, a delay circuit 33, and a variable voltage frequency generator 34. The sigma-delta modulation circuit of the present embodiment functions as an A/D converter as a whole.

The subtractor 30, the integrator 31, and the binary comparator 32 are analog type arithmetic and logic units.

The subtractor 30 subtracts a conversion signal S34 from the input signal $S_{IN}$ and outputs a subtracted signal S30 to the integrator 31.

The integrator 31 integrates the subtracted signal S30 from the subtractor 30 and outputs an integrated signal S31 to the binary comparator 32.

The binary comparator 32 compares the integrated signal S31 with a predetermined reference value. When the integrated signal S31 is larger than the reference value, it generates "+1" as an output signal, while when the integrated signal S31 is smaller than the reference value, it generates "−1". The output signal from the binary comparator 32 is output as an output signal $S_{OUT}$ of the sigma-delta modulation circuit and input to the delay circuit 33.

The delay circuit 33 generates a delay signal S33 by giving a delay time of, for example, one sampling period to the output signal $S_{OUT}$ of the sigma-delta modulation circuit and outputs the result to the variable voltage frequency generator 34.

The variable voltage frequency generator 34 selects a positive voltage or a negative voltage, both voltages having the same absolute value, in accordance with the value of the delay signal S33 from the delay circuit 33 and changes the absolute value (amplitude) of the voltage to output according to the value of the amplitude parameter set by an amplitude control signal $S_{PA}$. The determined voltage is output as a modulation signal S34.

In the sigma-delta modulation circuit of the second embodiment, for example, when the delay signal S33 from the delay circuit 33 is positive and the value of the parameter set by the amplitude control signal $S_{PA}$ is k, the conversion signal S34 having a voltage level of Δk is output to the subtractor 30. Then, the subtractor 30 subtracts the conversion signal S34 from the input signal $S_{IN}$. The subtracted signal S30 is output to the integrator 31. The subtracted signal S30 is integrated in the integrator 31, and the integrated signal S31 is compared with a predetermined reference value in the binary comparator 32. As a result, a digital output signal $S_{OUT}$ of a sign in accordance with the integrated signal S31 from the binary comparator 32 is output.

On the other hand, when the delay signal S33 from the delay circuit 33 is negative and the value of the parameter set by the amplitude control signal $S_{PA}$ is k, a conversion signal S34 of a voltage level of −Δk is output to the subtractor 30. In the subtractor 30, the input signal $S_{IN}$ is subtracted from the conversion signal S34 and the subtracted signal S30 is output to the integrator 31. The subtracted signal S30 is integrated in the integrator 31. The integrated signal S31 is compared with a predetermined reference value in the binary comparator 32.

According to the sigma-delta modulation circuit of the second embodiment, in the same way as the sigma-delta modulation circuit shown in the first embodiment, by changing the value of the amplitude parameter set by the amplitude control signal $S_{PA}$ from the outside, for example, by setting the absolute value of the amplitude of the conversion signal S34 output from the variable voltage frequency generation circuit 34 to 1/k, the amplitude of the modulation signal output from the sigma-delta modulation circuit, that is, the amplitude of the output signal $S_{OUT}$ from the binary comparator 32, is output as a multiple of k.

Third Embodiment

Figure 3:
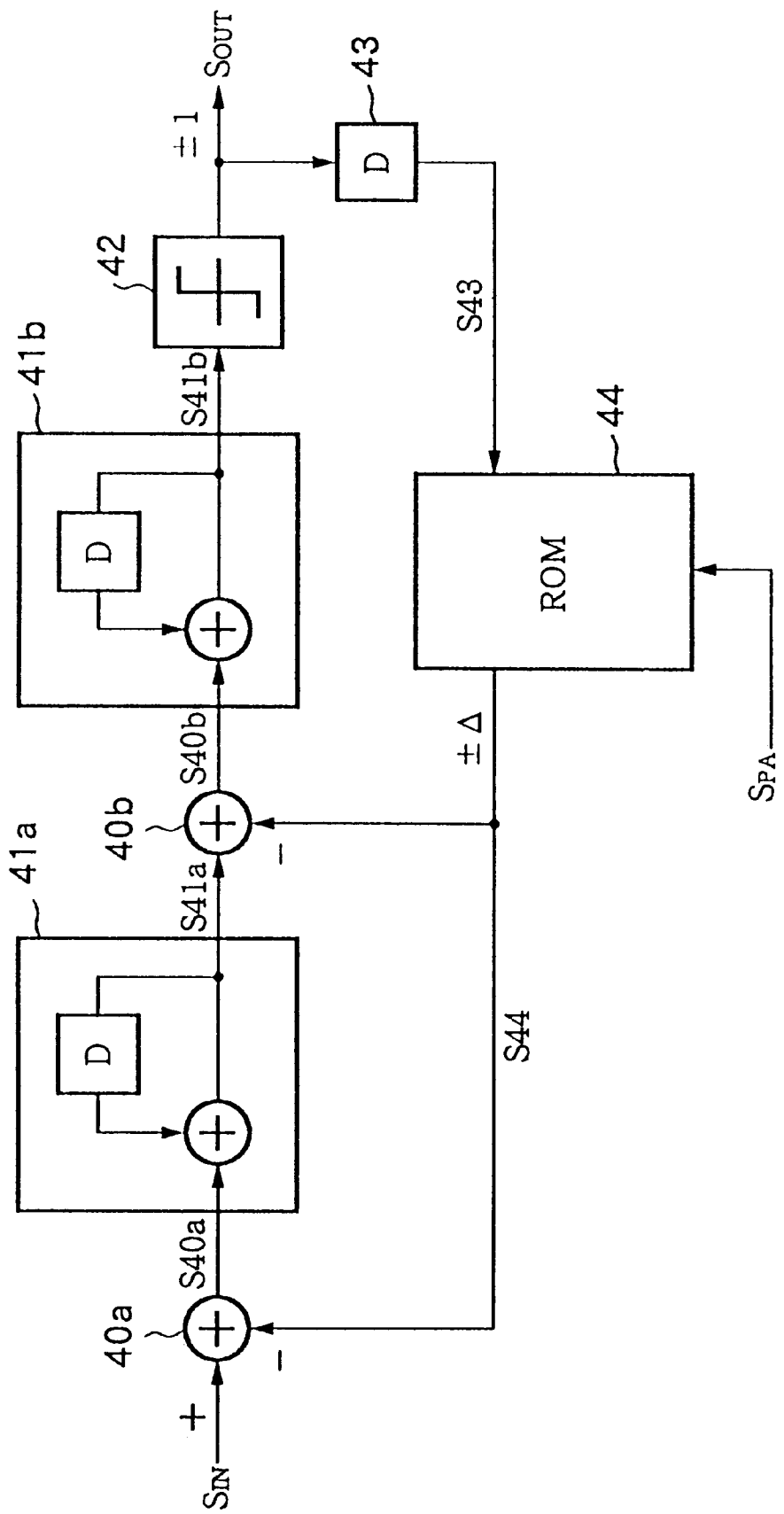
FIG. 3 is a circuit diagram of a sigma-delta modulation circuit according to a third embodiment of the present invention.

FIG. 3 is a circuit diagram of the sigma-delta modulation circuit according to a third embodiment of the present invention.

As shown in the figure, the sigma-delta modulation circuit of the third embodiment comprises subtractors 40a and 40b, accumulators 41a and 41b, a binary comparator 42, a delay circuit 43, and a ROM 44. This sigma-delta modulation circuit functions as a D/A converter as a whole.

The subtractors 40a, 40b, the accumulators 41a, 41b, and the binary comparator 42 are digital type arithmetic and logic units.

A noise shaper of the present embodiment comprises a circuit having a second transfer function characteristic realized by the subtractors 40a, 40b and the accumulators 41a and 41b.

The accumulators 41a and 41b have the same structure as the accumulators of the first embodiment. Each of them comprises an adder and a delay circuit. Each cumulatively adds the input signal at a predetermined time interval of, for example, one sampling period and outputs the cumulative addition signal.

As shown in FIG. 1, the subtractor 40a calculates the difference signal S40a between the input signal $S_{IN}$ and the conversion signal S44 from the ROM 44 and outputs the result to the accumulator 41a. The accumulator 41a cumulatively adds the difference signal S40a every sampling period and outputs a first cumulative addition signal S41a.

The subtractor 40b calculates the difference signal S40b between the first cumulative addition signal S41a and the conversion signal S44 from the ROM 44 and outputs the result to the second cumulative addition signal 41b. The accumulator 41b cumulatively adds the difference signal S40b every sampling period and outputs the second cumulative addition signal 41b.

The binary comparator 42 compares the second cumulative addition signal 41b with a predetermined reference value. When the second cumulative addition signal 41b is larger than the reference value, it generates "+1" as an output signal $S_{OUT}$, while when the second cumulative addition signal 41b is smaller than the reference value, it generates "−1". This output signal is output as an output signal $S_{OUT}$ of the sigma-delta modulation circuit and is also output to the delay circuit 43.

The delay circuit 43 delays the output signal $S_{OUT}$ of the sigma-delta modulation circuit by giving a delay time of, for example, one sampling period and generates a delay signal S43 to the ROM 44.

The ROM 44 of the present embodiment has a similar structure and function as the ROM 24 of the first embodiment. It outputs a conversion signal S44 having a predetermined level in response to the delay signal S43 from the delay circuit 43 and the value of the amplitude parameter set by the amplitude control signal $S_{PA}$.

In the present embodiment, a noise shaper having a second transfer function performs arithmetic processing on the input signal $S_{IN}$ from the outside and the conversion signal S44 from the ROM 44 and outputs the result as a second cumulative addition signal 41b.

The binary comparator 42 compares the second cumulative addition signal 41b with a predetermined value and generates an output signal $S_{OUT}$ of, for example, "+1" or "−1", in response to the comparison result. Further, the output signal $S_{OUT}$ is input to the delay circuit 43. A delay signal S43 is generated by giving a delay time of, for example, one sampling period. The delay signal S43 is input to the ROM 44.

The ROM 44 outputs a conversion signal S44 having an adjusted level in response to the amplitude parameter set by the amplitude control signal $S_{PA}$ and the delay signal S43.

Accordingly, by setting the parameter k by the amplitude control signal $S_{PA}$ in accordance with the desired amplitude to the ROM 44, it is possible to equivalently set the amplitude of the output signal $S_{OUT}$ of the sigma-delta modulation to a multiple of k. Therefore, it is possible to adjust the amplitude by a small sized, simplified structure.

Fourth Embodiment

Figure 4:
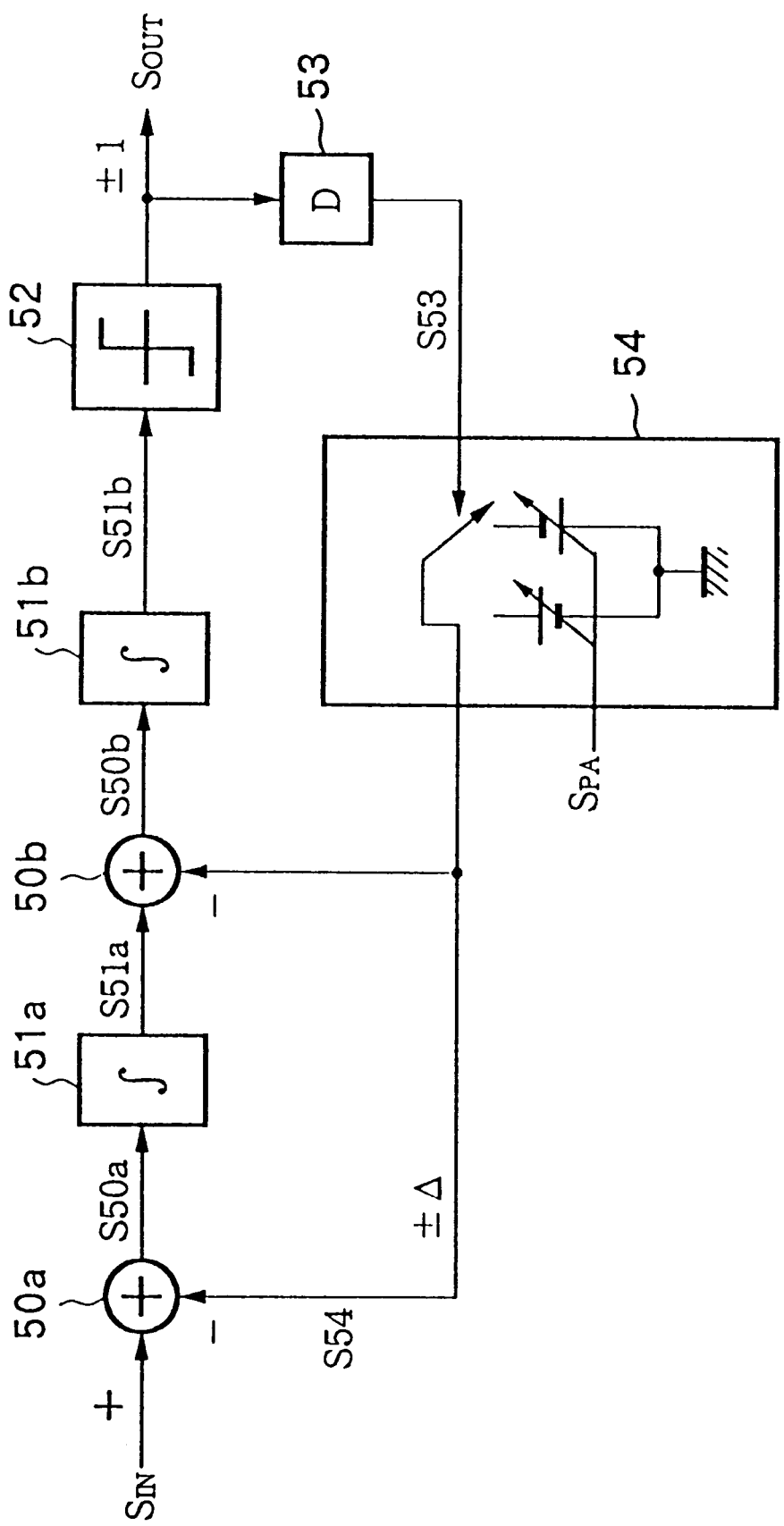
FIG. 4 is a circuit diagram of a sigma-delta modulation circuit according to a fourth embodiment of the present invention.

FIG. 4 is a circuit diagram of the sigma-delta modulation circuit according to a fourth embodiment of the present invention.

As shown in FIG. 4, the sigma-delta modulation circuit of the fourth embodiment comprises subtractors 50a, 50b, integrators 51a, 51b, a binary comparator 52, a delay circuit 53, and a variable voltage frequency generator 54. Note that the sigma-delta modulation circuit of the present embodiment functions as an A/D converter as a whole.

The subtractors 50a, 50b, the integrators 51a, 51b, and the binary comparator 52 are analog type arithmetic and logic units.

The noise shaper of the present embodiment comprises a circuit having a second transfer function characteristic realized by the subtractors 50a, 50b and the integrators 51a, 51b.

The integrators 51a and 51b perform an integration operation on the input signal and output the result as an integrated signal.

As shown in FIG. 4, the subtractor 50a calculates the difference signal S50a between the input signal $S_{IN}$ and the conversion signal S54 from the variable voltage frequency generator 54 and outputs the result to the integrator 51a. The integrator 51a integrates the difference signal S50a and outputs the result as an integrated signal S51a.

The subtractor 50b calculates the difference signal S50b between the integrated signal S51a and the conversion signal S54 from the variable voltage frequency generator 54 and outputs the result to the integrator 51b. The integrator 51b integrates the difference signal S50b and outputs the result as an integrated signal S51b.

The binary comparator 52 compares the integrated signal S51b with a predetermined reference value. When the integrated signal S51b is larger than the reference value, it generates "+1" as the output signal $S_{OUT}$, while when the integrated signal S51b is smaller than the reference value, it generates "−1". The output signal is output as an output signal $S_{OUT}$ of the sigma-delta modulation circuit and is also output to the delay circuit 53.

The delay signal 53 delays the output signal $S_{OUT}$ of the sigma-delta modulation circuit by giving a delay time of, for example, one sampling period and outputs the generated delay signal S53 to the variable voltage frequency generator 54.

The variable voltage frequency generator 54 of the fourth embodiment has the same structure and function as the variable voltage frequency generator 34 of the second embodiment shown in FIG. 2. It outputs a conversion signal S54 of a predetermined level in accordance with the delay signal S53 from the delay circuit 53 and the value of the amplitude parameter set by the amplitude control signal $S_{PA}$.

In the fourth embodiment, a noise shaper having a second transfer function performs arithmetic processing on the input signal $S_{IN}$ from the outside and to the conversion signal S54 from the variable voltage frequency generator 54 and outputs the result as an integrated signal S51b.

The binary comparator 52 compares the integrated signal S51b with a predetermined reference value and generates an output signal $S_{OUT}$ of, for example, "+1" or "−1", in accordance with the result of the comparison. Further, the output signal $S_{OUT}$ is input to the delay circuit 53, wherein a delay signal S53 is generated by giving a delay time of, for example, one sampling period. The result is input to the variable voltage frequency generator 54.

The variable voltage frequency generator 54 outputs a conversion signal S54 having an adjusted level in accordance with the amplitude parameter set by the amplitude control signal $S_{PA}$ and the delay signal S53.

Consequently, the amplitude control signal $S_{PA}$ can equivalently set the amplitude of the output signal $S_{OUT}$ of the sigma-delta modulation circuit to a multiple of k by setting the parameter k in accordance with the desired amplitude to the variable voltage frequency generator 54. Therefore, it is possible to adjust the amplitude by a small sized, simplified circuit structure.

Fifth Embodiment

Figure 5:
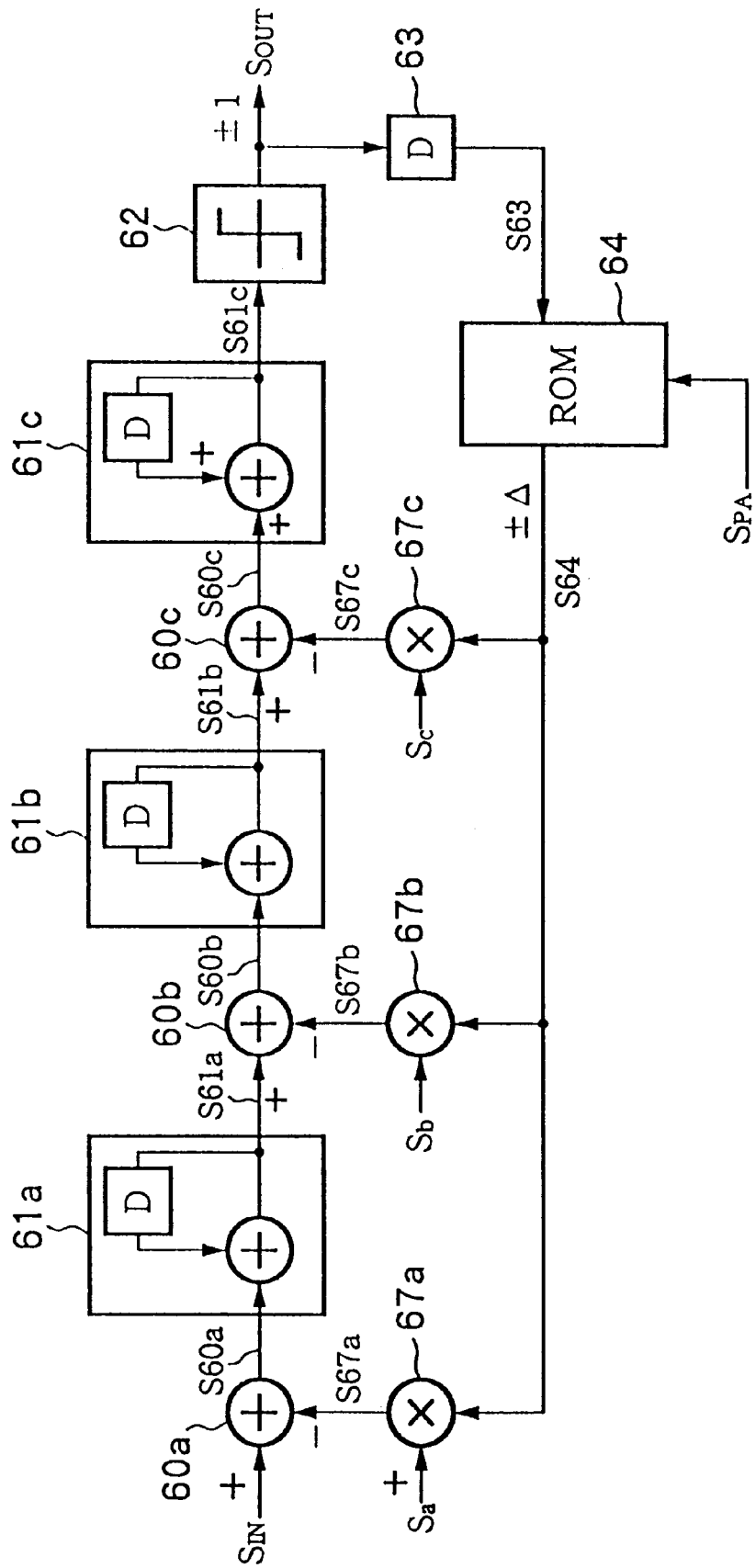
FIG. 5 is a circuit diagram of a sigma-delta modulation circuit according to a fifth embodiment of the present invention.

FIG. 5 is a circuit diagram of the sigma-delta modulation circuit according to a fifth embodiment of the present invention.

As shown in FIG. 5, the sigma-delta modulation circuit of the fifth embodiment comprises subtractors 60a, 60b, and 60c, accumulators 61a, 61b, and 61c, multipliers 67a, 67b, and 67c, a binary comparator 62, a delay circuit 63, and a ROM 64. This sigma-delta modulation circuit functions as a D/A converter as a whole.

The subtractors 60a, 60b, and 60c, the accumulators 61a, 61b, and 61c, the multipliers 67a, 67b, and 67c, and the binary comparator 62 are digital type arithmetic and logic units.

The noise shaper of the fifth embodiment comprises a circuit having a third transfer function characteristic realized by the subtractors 60a, 60b, and 60c, the accumulators 61a, 61b, and 61c, and the multipliers 67a, 67b, and 67c.

The accumulators 61a, 61b, and 61c have the same structure as the accumulator 21 of the first embodiment. Each of them comprises an adder and a delay circuit. The accumulators 61a, 61b, and 61c cumulatively add the input signal at a predetermined time interval of, for example, every sampling period and outputs a cumulative addition signal.

The multipliers 67a, 67b, and 67c perform processing for multiplying the conversion signal S64 from the ROM 64 with a parameter set by level adjusting signals Sa, Sb, and Sc input from the outside and generate the multiplied results S67a, S67b, and S67c which are output respectively to the subtractors 60a, 60b, and 60c.

As shown in FIG. 5, the subtractor 60a calculates the difference of the input signal $S_{IN}$ and the multiplied signal S67a from the multiplier 67a and outputs the obtained difference signal S60a to the accumulator 61a. The accumulator 61a cumulatively adds the difference signal S60a every sampling period and outputs the result as a cumulative addition signal 61a.

The subtractor 60b calculates the difference of the cumulative addition signal S61a and the multiplied signal S67b from the multiplier 67b and outputs the result to the accumulator 61b. The accumulator 61b cumulatively adds the difference signal S60b every sampling period and outputs the result as a cumulative addition signal S61b.

The subtract or 60c calculates the difference of the cumulative addition signal S61b and the multiplied signal S67c from the multiplier 67c and outputs the obtained difference signal S60c to the accumulator 61c. The accumulator 61c cumulatively adds the difference signal S60c every sampling period and outputs a cumulative addition signal S61c.

The binary comparator 62 compares the cumulative addition signal S61c with the predetermined reference value. When the cumulative addition signal S61c is larger than the reference value, it generates "+1" as an output signal $S_{OUT}$, while when the cumulative addition signal S61c is smaller, it generates "−1". The output signal from the binary comparator 62 is output as an output signal of the sigma-delta modulation circuit $S_{OUT}$ and is also output to the delay circuit 63.

The delay circuit 63 delays the output signal $S_{OUT}$ of the sigma-delta modulation circuit by giving a delay time of, for example, one sampling period and outputs the obtained delay signal S63 to the ROM 64.

The ROM 64 of the fifth embodiment has the same structure and the function as the ROM 24 of the first embodiment shown in FIG. 1. It outputs a conversion signal S64 of a predetermined level in accordance with the delay signal S63 from the delay circuit 63 and the value of the amplitude parameter set by the amplitude control signal $S_{PA}$.

In the fifth embodiment, a noise shaper having a third transfer function performs arithmetic processing to the input signal $S_{IN}$ from the outside and the conversion signal S64 from the ROM 64 and outputs a cumulative addition signal S64c as the calculated result.

The binary comparator 62 compares the cumulative addition signal S61c with a predetermined reference value and generates an output signal $S_{OUT}$ of, for example, "+1" or "−1" in accordance with the comparison result. Further, the output signal $S_{OUT}$ is input to the delay circuit 63, wherein a delay signal S63 is generated by giving a delay time of, for example, one sampling period and output to the ROM 64.

The ROM 64 outputs a conversion signal S64 having an adjusted level in accordance with the amplitude parameter set by the amplitude control signal $S_{PA}$ and the delay signal S63.

Therefore, by setting a parameter k in accordance with the desired amplitude to the ROM 64 by the amplitude control signal $S_{PA}$, it is possible to equivalently set the amplitude of the output signal $S_{OUT}$ of the sigma-delta modulation circuit to a multiple of k. Consequently, it is possible to adjust the amplitude by a small sized, simplified circuit structure.

Sixth Embodiment

Figure 6:
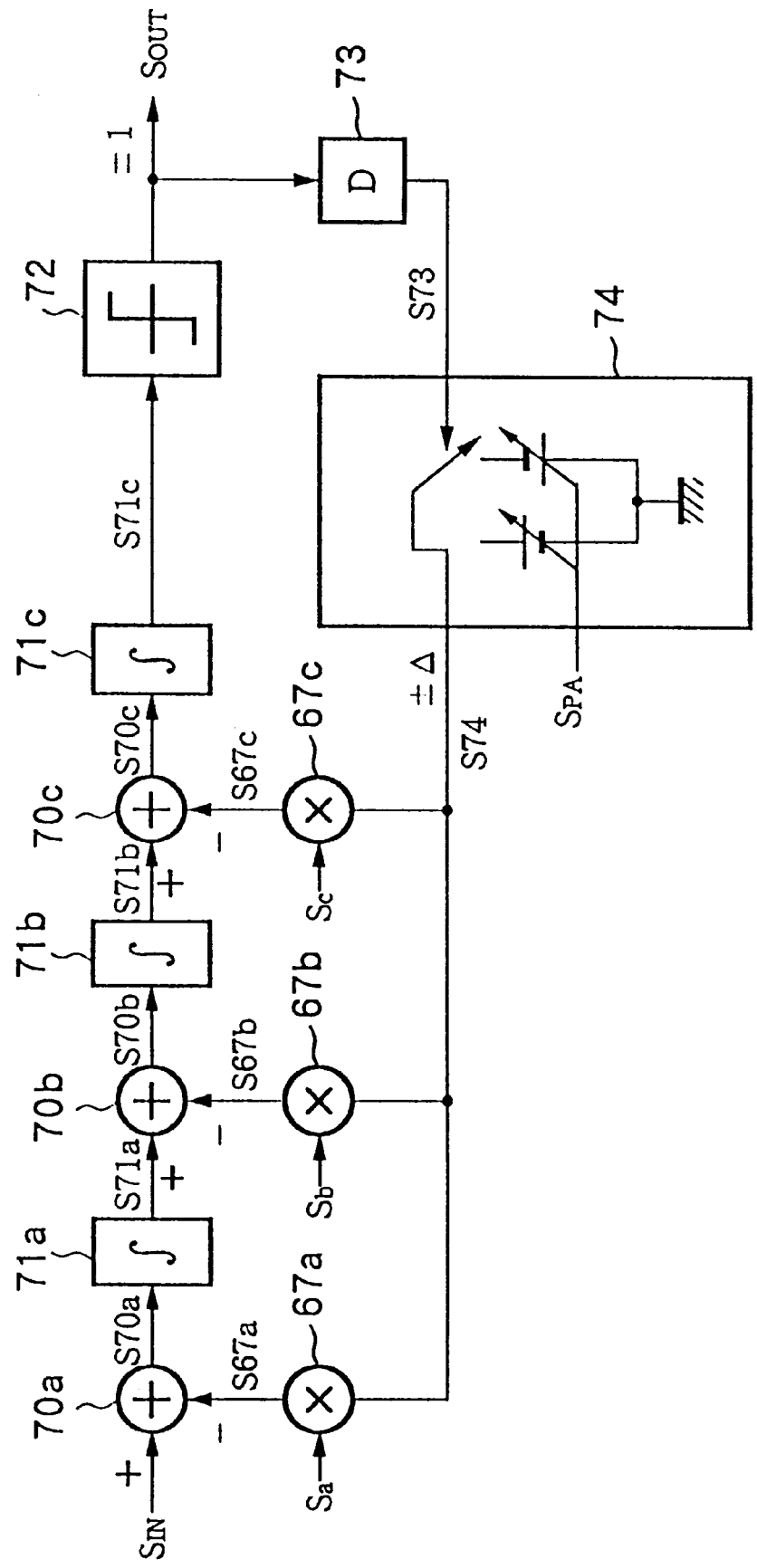
FIG. 6 is a circuit diagram of a sigma-delta modulation circuit according to a sixth embodiment of the present invention.
Figure 7:
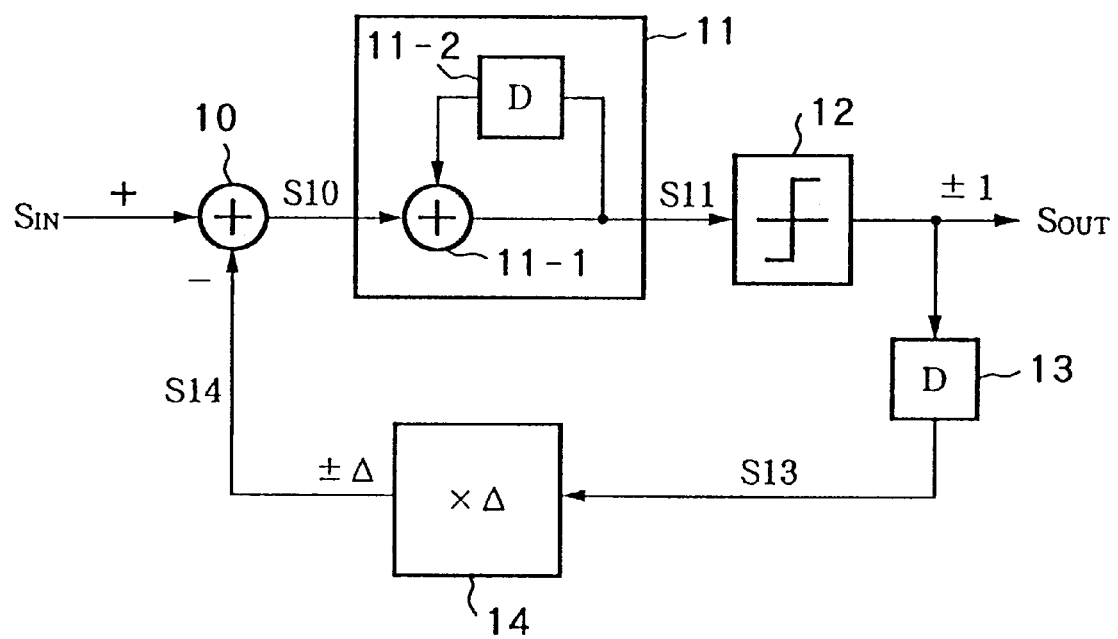
FIG. 7 is a circuit diagram of the configuration of a sigma-delta modulation circuit of the related art.

FIG. 6 is a circuit diagram of the sigma-delta modulation circuit according to a sixth embodiment of the present invention.

As shown in FIG. 6, the sigma-delta modulation circuit of the sixth embodiment comprises subtractors 70a, 70b, and 70c, integrators 71a, 71b, and 71c, multipliers 67a, 67b, and 67c, a binary comparator 72, a delay circuit 73, and a variable voltage frequency generator 74. Note that the sigma-delta modulation circuit of the present embodiment functions as an A/D converter as a whole.

The subtractors 70a, 70b, and 70c, the integrators 71a, 71b, and 71c, the multipliers 67a, 67b, and 67c, and the binary comparator 72 are analog type arithmetic and logic units.

The noise shaper of the present embodiment comprises a circuit having a second transfer function characteristic realized by the subtractors 70a, 70b, and 70c, the integrators 71a, 71b, and 71c, and the multipliers 67a, 67b, and 67c.

The integrators 71a, 71b, and 71c perform integration on the input signal and output the result as an integrated signal.

The multipliers 67a, 67b, and 67c perform processing for multiplying the conversion signal S74 from the variable voltage frequency generator 74 with a parameter set by the level adjustment signals Sa, Sb, and Sc input from the outside and generate the multiplied results S78a, S67b, and S67c which are output respectively to the subtractors 70a, 70b, and 70c.

As shown in FIG. 5, the subtractor 71a calculates the difference of the input signal $S_{IN}$ and the multiplied signal S67a from the multiplier 67a and outputs the obtained difference signal S70a to the integrator 71a. The integrator 71a integrates the difference signal S70a and outputs the result as an integrated signal S71a.

The subtractor 70b calculates the difference of the integrated signal S71a and the multiplied signal S67b from the multiplier 67b and outputs the result to the integrator 71b. The integrator 71b integrates the difference signal S70b and outputs the result as an integrated signal S71b.

The subtractor 70c calculates the difference of the integrated signal S71b and the multiplied signal S67c from the multiplier 67c and outputs the result to the integrator 71c. The integrator 71c integrates the difference signal S70c and outputs the result as an integrated signal S71c.

The binary comparator 72 compares the integrated signal S71c with the predetermined reference value. When the integrated signal S71c is larger than the reference value, it generates "+1" as an output signal $S_{OUT}$, while when the integrated signal S71c is smaller than the reference value, it generates "−1". The output signal from the binary comparator 72 is output as an output signal $S_{OUT}$ of the sigma-delta modulation circuit and also output to the delay circuit 73.

The delay circuit 73 delays the output signal $S_{OUT}$ of the sigma-delta modulation circuit by giving a delay time of, for example, one sampling period and outputs the generated delay signal S73 to the variable voltage frequency generator 74.

The variable voltage frequency generator 74 of the fifth embodiment has the same structure and function as the variable voltage frequency generator 34 of the second embodiment shown in FIG. 2. It outputs a conversion signal S74 of a predetermined level in accordance with the delay signal S73 from the delay circuit 73 and the value of the amplitude parameter set by the amplitude control signal $S_{PA}$.

In the present embodiment, a noise shaper having a third transfer function performs arithmetic processing on the input signal $S_{IN}$ from the outside and the conversion signal S74 from the variable voltage frequency generator 74 and outputs an integrated signal S71c as the result.

The binary comparator 72 compares the integrated signal S71c with a predetermined reference value and generates an output signal of, for example, "+1" or "−1" in response to the comparison result. Further, the output signal $S_{OUT}$ is also output to the delay circuit 73. The delay circuit 73 generates a delay signal S73 by giving a delay time of, for example, one sampling period and the delay signal S73 is input to the variable voltage frequency generator 74.

The variable voltage frequency generator 74 outputs the conversion signal of an adjusted level in accordance with the amplitude parameter set by the amplitude control signal $S_{PA}$ and the delay signal S73.

Therefore, by setting a parameter k in accordance with the desired amplitude to the variable voltage frequency generator 74 by the amplitude control signal $S_{PA}$, it is possible to set the amplitude of the output signal $S_{OUT}$ of the sigma-delta modulation circuit to a multiple of k. Accordingly, it is possible to adjust the amplitude by a small sized, simplified circuit structure.

Note that while the above embodiments describes examples with reference to first, second, and third noise shapers and a binary comparator, the present invention is not limited to the above and may be applied to a sigma-delta modulation circuit having a higher degree noise shaper and N-ary comparator (N≧2, N is an integer).

As explained above, according to the present invention, there is an advantage that a sigma-delta modulation circuit having a function of adjusting the amplitude can be realized by a small sized, simplified circuit structure.

What is claimed is:

1. A sigma-delta modulator comprising:
   computing means receiving an input signal;

cumulation means for cumulating a signal from said computing means;

comparison means for comparing a cumulation signal from said cumulation means with a predetermined reference value and outputting a modulation signal which is finite and has any one of a plurality of values, the values being defined in accordance with a level of the input signal;

delay means for delaying the modulation signal by a predetermined time to produce a delayed modulation signal; and conversion means for (1) receiving a control signal and (2) converting the delayed modulation signal from said delay means to a conversion signal in response to a parameter which is arbitrarily set by the control signal, wherein said computing means processes the input signal and the conversion signal in a predetermined manner and outputs a signal to said cumulation means.

2. A sigma-delta modulator according to claim 1, wherein said computing means subtracts said conversion signal from said input signal.

3. A sigma-delta modulator according to claim 1, wherein said computing means comprises:

first subtraction means for subtracting the conversion signal from the input signal and outputting a first subtraction signal;

first cumulation means for cumulating the first subtraction signal and outputting a first cumulation signal; and second subtraction means for subtracting the conversion signal from the first cumulation signal.

4. A sigma-delta modulator according to claim 1, wherein said computing means comprises a plurality of circuit means connected in series from an initial stage to a final stage, each circuit means comprising:

level adjustment means for adjusting the level of the conversion signal in response to a predetermined constant;

first subtraction means for subtracting the level adjusted conversion signal from the input signal; and cumulation means for cumulating the subtracted-signal and outputting the cumulated subtracted signal as a cumulation signal;

said sigma-delta modulator further comprising:

an additional level adjustment means for adjusting the level of the conversion signal in response to an additional predetermined constant; and an additional subtraction means for subtracting the conversion signal adjusted by said additional level adjusting means from an output signal from the final stage of said plurality of series connected circuit means.

5. A sigma-delta modulator according to claim 1, wherein said conversion means comprises a multiplication means for multiplying the delayed modulation signal and a constant defined by the parameter arbitrarily set by the control signal and outputting a multiplied signal.

6. A sigma-delta modulator according to claim 1, wherein said conversion means comprises a logical processing means for (1) processing the delayed modulation signal by a first logical processing method, (2) processing the arbitrarily set parameter by a second logical processing method, and (3) outputting output data as a result of said first and second logical processing methods.

7. A sigma-delta modulator according to claim 6, wherein said logical processing means comprises a memory means for storing data in a table and wherein said output data is determined by a table look-up of the delayed modulation signal and the arbitrarily set parameter.

8. A sigma-delta modulator according to claim 1, wherein said conversion means comprises a variable voltage providing means for (1) controlling the delayed modulation signal in response to the arbitrarily set parameter and (2) providing the conversion signal having a variable level in accordance with the arbitrarily set parameter.

9. A sigma-delta modulator according to claim 1, wherein the input signal is a digital signal and wherein said cumulation means comprises a digital accumulator cumulatively adding the computed signal at predetermined time intervals.

10. A sigma-delta modulator according to claim 1, wherein the input signal is an analog signal and wherein said cumulation means comprises an analog integrator integrating the computed signal.

11. A sigma-delta modulator according to claim 1, wherein said computing means, said cumulation means, said comparison means, said delay means, and said conversion means operate by a predetermined sampling period.

12. A sigma-delta modulator according to claim 11, wherein said modulator further comprises a sampling means for sampling the input signal and outputting the sampled input signal to said computing means.

13. A sigma-delta modulator according to claim 12, wherein the predetermined time is defined by the sampling time.

14. A sigma-delta modulator according to claim 12, wherein said cumulation means comprises an adding means and a delay means, said adding means adding the signal from said computing means and a delay signal from said delay means, said delay means delaying the added signal from said adding means by a predetermined sampling time and outputting the delayed added signal to said adding means.

15. A sigma-delta modulator comprising:

computing means receiving an input signal;

cumulation means for cumulating a signal from said computing means;

comparison means for comparing a cumulation signal from said cumulation means with a predetermined reference value and outputting a modulation signal which is finite and has any one of a plurality of values, the values being defined in accordance with a level of the input signal;

delay means for delaying the modulation signal by a predetermined time to produce a delayed modulation signal; and conversion means for (1) receiving a control signal and (2) converting the delayed modulation signal from said delay means to a conversion signal in response to a parameter which is arbitrarily set by the control signal, said conversion means comprising:

a logical processing means for (1) processing the delayed modulation signal by a first logical processing method, (2) processing the arbitrarily set parameter by a second logical processing method, and (3) outputting the conversion signal as a result of said first and second logical processing methods, wherein said computing means processes the input signal and the conversion signal in a predetermined manner and outputs a signal to said cumulation means.

16. A sigma-delta modulator comprising:

computing means receiving an input signal;

cumulation means for cumulating a signal from said computing means;

comparison means for comparing a cumulation signal from said cumulation means with a predetermined reference value and outputting a modulation signal which is finite and has any one of a plurality of values, the values being defined in accordance with a level of the input signal;

delay means for delaying the modulation signal by a predetermined time to produce a delayed modulation signal; and conversion means for (1) receiving a control signal and (2) converting the delayed modulation signal from said delay means to a conversion signal in response to a parameter which is arbitrarily set by the control signal, said conversion means comprising:

a variable voltage providing means for (1) controlling the delayed modulation signal in response to the arbitrarily set parameter and (2) providing the conversion signal having a variable level in accordance with the arbitrarily set parameter, wherein said computing means processes the input signal and the conversion signal in a predetermined manner and outputs a signal to said cumulation means.

17. A sigma-delta modulator comprising:

computing means receiving an input signal;

cumulation means for cumulating a signal from said computing means;

comparison means for comparing a cumulation signal from said cumulation means with a predetermined reference value and outputting a modulation signal which is finite and has any one of a plurality of values, the values being defined in accordance with a level of the input signal;

delay means for delaying the modulation signal by a predetermined time to produce a delayed modulation signal; and conversion means for (1) receiving a control signal and (2) converting the delayed modulation signal from said delay means to a conversion signal in response to a parameter which is arbitrarily set by the control signal, said conversion means comprising:

a logical processing means for (1) processing the delayed modulation signal by a first logical processing method, (2) processing the arbitrarily set parameter by a second logical processing method, and (3) outputting the conversion signal as a result of said first and second logical processing methods, said logical processing means comprising:

memory means for storing data in a table and wherein said output data is determined by a table look-up of the delayed modulation signal and the arbitrarily set parameter, wherein said computing means processes the input signal and the conversion signal in a predetermined manner and outputs a signal to said cumulation means.

* * * * *